United States Patent
Leichsenring et al.

(10) Patent No.: US 6,410,205 B1
(45) Date of Patent: Jun. 25, 2002

(54) PHOTOSENSITIVE RECORDING MATERIAL PROVIDED WITH A COVERING LAYER

(75) Inventors: Thomas Leichsenring, Mainz; Thorsten Lifka, Aarbergen; Mario Boxhorn, Mainz, all of (DE)

(73) Assignee: AGFA-Gevaert (BE)

( * ) Notice: Subject to any disclaimer, the term of this patent is extended or adjusted under 35 U.S.C. 154(b) by 0 days.

(21) Appl. No.: 09/660,376

(22) Filed: Sep. 12, 2000

(30) Foreign Application Priority Data

Sep. 14, 1999 (DE) .......................... 199 44 073

(51) Int. Cl.$^7$ ............... G03F 7/09; G03F 7/11
(52) U.S. Cl. ................ 430/273.1; 430/300; 524/127; 524/128; 524/243
(58) Field of Search .............. 430/273.1, 300; 524/127, 128, 243

(56) References Cited

U.S. PATENT DOCUMENTS

| | | | |
|---|---|---|---|
| 3,753,715 A | * | 8/1973 | Klüpfel et al. ........... 430/273.1 |
| 4,009,115 A | * | 2/1977 | Binns ......................... 252/142 |
| 5,035,981 A | | 7/1991 | Kurtz et al. ................. 430/327 |
| 5,037,482 A | * | 8/1991 | Kukanskis et al. ............ 134/3 |
| 6,054,249 A | * | 4/2000 | Nagahara et al. ........ 430/273.1 |

FOREIGN PATENT DOCUMENTS

| | | | |
|---|---|---|---|
| EP | 290916 | | 11/1988 |
| EP | 316618 | | 5/1989 |
| EP | 716345 | | 6/1996 |
| EP | 716346 | | 6/1996 |
| JP | 62-79440 | * | 4/1987 |
| JP | 62079440 | | 4/1987 |

OTHER PUBLICATIONS

Koizumi, 107:187497, CA, ACS, English Abstract of JP62–79440, 1 page, Apr. 1987.*
Registry No. 9002–92–0, ACS, 2 pages, 2001.*

* cited by examiner

Primary Examiner—Cynthia Hamilton
(74) Attorney, Agent, or Firm—Connolly Bove Lodge & Hutz LLP

(57) ABSTRACT

The present invention relates to a photosensitive recording material comprising a base, a photopolymerisable layer and a covering layer containing a mixture of at least one water-soluble or at least water-dispersible polymer and at least one additive, the additive being selected from the group consisting of alkoxylated alkylenediamines, alkoxylated ($C_{10}$–$C_{25}$) alkanols, phosphoric acid ($C_1$–$C_{15}$) alkyl esters and phosphoric acid ($C_1$–$C_{15}$) alkyl esters and the amount of the additive being in the range of 0.001 to 10.0% by weight, relative to the total weight of the non-volatile components of the covering layer. The present invention also relates to a process for preparing an offset printing plate with this recording material.

18 Claims, No Drawings

PHOTOSENSITIVE RECORDING MATERIAL PROVIDED WITH A COVERING LAYER

The present invention relates to a photosensitive recording material comprising a base, a photopolymerisable layer and on top of that a covering layer being transparent to actinic radiation. The present invention also relates to a process for preparing an offset printing plate with this recording material.

Recording materials of this kind are already known. For example U.S. Pat. No. 3,458,311 discloses a recording material provided with a relatively thin covering layer ("overcoat") being transparent to actinic radiation. The covering layer is water-permeable, but only slightly permeable to (atmospheric) oxygen. The layer has a weight of approximately 0.2 to 3 g/m$^2$ and is made of a polymeric material being soluble in the conventional aqueous-alkaline developers. However the covering layer is not easily removable by simply stripping it off. As its essential function, the covering layer keeps atmospheric oxygen away from the photopolymerisable layer, atmospheric oxygen having an inhibiting effect on the photopolymerisation reaction. The covering layer is prepared by applying an aqueous solution of the polymeric material onto the photopolymerisable layers and drying it. The solutions used therefore contain at least one polymer being soluble at 20° C. in water or a mixture of water and an organic water-miscible solvent. Preferred polymers are polyvinyl alcohol, polyvinylpyrrolidone, gum arabic, copolymers of methyl vinyl ether and maleic anhydride and polyethylene glycol. The covering layer may additionally comprise wetting agents, especially sodium alkylsulphates, N-cetyl or C-cetyl betaine, alkyl aminocarboxylates or -dicarboxylates or polyethylene glycols having an average molecular weight of less than 400. Wetting agents strongly affect the coating properties. The covering layers described in U.S. Pat. No. 3,458,311 are thinner and adhere more uniformly to the photopolymer layer, being however less permeable to oxygen than strippable overcoats.

Printing forms prepared from this recording material have an improved contrast and sensitivity and allow longer print runs than printing plates made of a comparable recording material provided with a strippable overcoat.

Recording materials of a fully similar kind are described in U.S. Pat. No. 4,072,527 and U.S. Pat. No. 4,072,528. These recording materials comprise a covering layer being virtually completely impermeable to oxygen and having a thickness varying between 0.2 and 25 μm, being here too not mechanically peelable, but removable by using an aqueous developer. The covering layer additionally contains solid particles having a diameter of at least 0.05 μm composed of a water-insoluble acrylic or alkacrylic (co)polymer or a water-insoluble copolymer of vinylpyrrolidone and vinyl acetate (U.S. Pat. No. 4,072,527) or a water-insoluble chlorinated vinyl polymer or vinyl copolymer (U.S. Pat. No. 4,072,528). Anionic or non-ionic surfactants are recommended as additives, in order to achieve a more uniform coating. Cationic surfactants however should be avoided, as they cause unwanted flocculation of the oppositely charged dispersion particles. The covering layer should make the recording materials insensitive to changes of temperature or atmospheric humidity and in addition thereto improve photosensitivity and image resolution.

EP-A 275 147 discloses a recording material for preparing planographic or flexographic printing plates. This recording material comprises a covering layer keeping atmospheric oxygen away from the underlying photopolymerisable layer. The covering layer contains a polymer being transparent to actinic radiation (preferably polyvinyl alcohol) and an amphoteric compound. By amphoteric compounds are to be understood compounds comprising both basic groups and acid groups. Suitable amphoteric compounds are for example amino acids which may be N-substituted. The amphoteric compound can also be in the form of a polymer or copolymer. Preferred amphoteric copolymers are copolymers comprising units of acrylic amides, aminoalkylacrylates or similar monomers and units of acid group-containing monomers as there are vinylphosphonic acid or (meth)acrylic acid. Amphoteric compounds of the above-mentioned nature often cause turbidity or flocculation in the coating solutions used for preparing the covering layer. Possible foaming on the coating solutions should also be taken into account.

EP-A 352 630 discloses a recording material comprising a layer base, a photopolymerisable layer and a covering layer containing a water-soluble polymer with low permeability to atmospheric oxygen (for example polyvinyl alcohol) and a water-soluble polymer binding atmospheric oxygen (for example polyalkylene imine). In this way also relatively thin covering layers having a thickness between 0.5 and 2.5 μm will be able to ensure an efficient barrier effect to oxygen. A complete elimination of oxygen however would deteriorate the storage stability of the recording material as a defined oxygen concentration is indeed needed, to scavenge radicals thermally produced in a dark reaction, said radicals would induce an uncontrolled crosslinking of the photosensitive layer (see J. Streeter in "Photopolymer Plate Technology Developments and Trends", 2nd Annual CtP Technology Conference Orlando, Fla. 31.1.1997). Moreover, polyalkylene imines increase the viscosity of the coating solutions and ensure a highly stable foaming. Foaming causes coating problems, leading to air bubbles in the covering layer and defects in the coating process.

EP-A 403 096 describes a photopolymerisable recording material, the covering layer of which contains a photoinitiator and optionally also a sensitising agent. The covering layer acts here again as oxygen barrier layer, thus ameliorating the speed and storage stability of the recording material. The addition of N,N-disubstituted aniline compounds, being simultaneously also substituted in para-position, to the photopolymerisable layer gives a further increase in storage stability. The covering layer may contain the same photoinitiator as the photopolymerisable layer or another one. The coating weight of the covering layer generally ranges from 0.5 to 3.3 g/m$^2$. Preferred photoinitiators are aromatic iodonium salts, trichloromethyl-s-triazines and other halogenated hydrocarbon compounds. The polymer in the covering layer preferably is polyvinyl alcohol or carboxymethyl cellulose. The storage stability of the recording material is increased by using a covering layer of this nature, the speed however decreases generally by up to two wedge steps on the 21-step Stouffer exposure gauge. It should be noted, that a loss of two steps implicates a decrease of the speed by half.

EP-A 487 343 relates to a process for preparing a lithographic printing plate. The starting material is a recording material, the photosensitive layer of which comprises an aromatic diazonium compound containing a carboxyl, a phenolic hydroxyl, a sulphonic, a sulphinic and/or a phosphorus oxy acid group. This photosensitive layer is coated in a separate step with a matting layer by melt-coating or spray coating. Although this process solves the air bubble problem encountered upon applying the layer by known flowing or roll coating methods, the above-mentioned formation of a homogeneous layer is however not yet ensured.

EP-A 509 514 describes a recording material comprising a base, a photopolymerisable layer and a protective layer being permeable to atmospheric oxygen. The protective layer has an oxygen permeability coefficient comprised between 10 and 13 cm²/s or more and is made preferably of hydroxyalkyl cellulose and/or polyethylene glycol. The protective layer is coated by ink-jet printing with an image layer composed of a material being transparent to light, but only weakly permeable to oxygen. This layer contains 0.2 to 15% by weight of a water-soluble or water-dispersible polymer (preferably polyvinyl alcohol, polyvinylpyrrolidone or a cellulose derivative), 0.5 to 40% by weight of a polyhydric alcohol (preferably a glycol) and 0.1 to 5% by weight of a surfactant (preferably polyethylene glycol lauryl ether, polyethylene glycol nonyl phenol ether or an aliphatic acid diethanol amide). During the subsequent over-all exposure a polymerisation in the photopolymerisable layer is only taking place in the areas in which the atmospheric oxygen is kept away by the overlying ink-jet printed image layer. In the other areas the oxygen inhibits virtually completely the polymerisation reaction, so that these areas can be removed during the subsequent development step. This process shows a disadvantage in that upon applying the image layer with an ink-jet printer, the underlying layer is partially dissolved. Moreover, the compositions used for ink-jet printing suffer from a tendency to foaming.

DE-A 38 34 960 describes a recording material comprising a photopolymerisable layer for preparing offset plates, wherein the photosensitive layer carries a protective layer made of polyvinyl alcohol and acid celluloses. The only task of the protective layer is to protect the photopolymerisable layer from penetration of atmospheric oxygen. Atmospheric oxygen would indeed have an inhibiting effect on the photopolymerisation occurring after the exposure.

EP-A 716 346 relates to a recording material comprising a photosensitive layer and a covering layer being soluble in developer solutions. The covering layer comprises a moisture-resistant component and an oxygen barrier component, optionally in combination with a particulate material and/or an antiflocculation agent. The oxygen barrier component exhibits an oxygen permeability rate of at most 10–14 cm²/s. A preferred oxygen barrier component is a polyvinyl alcohol, while an acryl(co)polymer, a styrene acrylate resin, a polyurethane or a polyester is preferred as moisture-resistant component. Generally preferred are moisture-resistant components having an acid number between 150 and 250. Both constituents may also be embedded in separate layers.

Details about oxygen permeation of selected polymers used in covering layers can be found in the article of K. Petrak and E. Pitts in *J. Appl. Polym. Sci.* 25[1980], p. 879–886.

A recording material coated with a photopolymerisable layer and an oxygen barrier layer applied thereto is also described in EP-A 738 929. The protective layer comprises a) a polyvinyl alcohol or a polyvinyl alcohol derivative and b) a polyvinylpyrrolidone or a vinylpyrrolidone copolymer, wherein the weight ratio a:b is in the range of 1:3 to 3:1, which makes both a high speed and an adequate adhesion to the photopolymerisable layer achievable.

Oxygen barrier covering layers made of water-soluble terpolymers comprising vinyl alcohol, vinyl carboxylate and vinyl amine units are disclosed in DE-A 196 39 897. The covering layers should adhere particularly well to photopolymerisable layers and effect an improved storage stability of the photosensitive recording materials.

Finally, a recording material for preparing planographic printing plates is also disclosed in WO 98/22852. It comprises a photopolymerisable layer and a polyphosphate-containing covering layer. The covering layer ensures a reduced tackiness of the materials and an improved resistance to atmospheric humidity. Besides polyphosphate, the covering layer also contains a film-forming hydrophilic polymer (for example polyvinyl alcohol, gum arabic, polymethacrylic acid, polyvinylsulphonic acid or polydiallyl dimethylammonium chloride). It may likewise contain further components, especially further water-soluble polymers or surfactants. This obviates the need of a separate development step for the imagewise exposed recording material, thus allowing to develop it directly on the press (on-press development). However, overcoats containing major amounts of soluble salts are not suited for automatic processors, as they cause rapid flocculation in the developer solutions and hence clogging of tubes. This necessitates a time-consuming cleaning of the development systems.

Besides their good oxygen barrier capacities, water-soluble 1-vinylitidazole polymers or copolymers, as described in WO 99/06890, exhibit, when used in covering layers, an improved adhesion to organic substrates, wherein an improvement of the printing properties is achieved, unlike polyalkylene imine containing layers which on further processing leave a more hydrophilic layer having poor ink accepting properties.

Modern photolithographic systems are usually developed, after imaging, in aqueous-alkaline solutions. Negative-working photolithographic recording materials usually comprise a base, optionally being pre-treated and containing a photohardenable layer. If the photohardenable layer is a photopolymer layer, it generally carries a covering layer ("overcoat"). The composition and thickness of the covering layer have a decisive influence on the speed and storage stability of a photopolymer system. Upon developing the imagewise exposed recording material, this covering layer is removed completely by the developer or by a rinse-off solution contained in a separate bath. The capacity of these baths depends to a decisive extent on the chemical composition of the dissolved layer and the concentration of the layer components in the baths.

Important parameters in the preparation of thin, optionally photosensitive layers are a.o. the capacity of the drier used and the coating weight before drying ("wet coating weight"), the rheological properties of the coating liquids and their tendency to form bubbles.

It is an object of the present invention to provide a recording material of the above-mentioned type, exhibiting an improved storage stability. It is a further object of the present invention to reduce as much as possible the weight of the covering layer and to diminish in this way the developer load, without however impairing the oxygen barrier function of the covering layer. Moreover, the covering layer should be coatable at high speed, exhibit a reduced bubble-forming tendency, unlike the coating liquids hitherto available, cause as few as possible foaming during processing and provide an increased developer capacity. The storage stability of the covering layer solutions should be improved substantially.

These objectives are accomplished by providing a recording material comprising a covering layer made of a mixture containing a water-soluble polymer and a special low molecular weight additive, the additive preferably exhibiting surfactant characteristics and improving the properties of the coating liquid to a decisive extent.

According to the present invention there is provided a photosensitive recording material comprising a base, a photopolymerisable layer and a covering layer, characterised in that the covering layer contains a mixture of at least one water-soluble or at least water-dispersible polymer and at least one additive, the additive being selected from the group consisting of alkoxylated alkylenediamines, alkoxylated ($C_{10}$–$C_{25}$) alkanols, phosphoric acid ($C_1$–$C_{15}$) alkyl esters and phosphoric acid ($C_1$–$C_{15}$) alkyl esters and the amount of the additive ranging from 0.001 to 10.0% by weight, relative to the total weight of the non-volatile components of the covering layer. The additives have a low molecular weight, i.e. generally exhibit an average molecular weight $M_w$ of no more than 3,000, whereas the water-soluble or water-dispersible polymers of the covering layer have an average molecular weight $M_w$ ranging from 5,000 to 1,000,000, preferably from 10,000 to 500,000.

Preferred (because of their commercial availability) are alkoxylated alkylenediamines, as they can be obtained e.g. by converting ethylenediamine, propylene-1,2-diamine or propylene-1,3-diamine, butane-1,2-diyldiamine, butane-1,3-diyldiamine or butane-1,4-diyldiamine or higher alkylenediamines with ethylene oxide and/or propylene oxide. The alkoxylated ($C_{10}$–$C_{25}$) alkanols can be derived from straight-chained or branched alkanols, e.g. from decanol, dodecanol, tridecanol, hexadecanol, octadecanol, 9-methyldecanol, 10-ethyldodecanol etc. Typical examples are ethoxylated and/or propoxylated ($C_{10}$–$C_{15}$) alkyl alcohols containing 6 to 13 ethylene oxide and/or propylene oxide units. Commercially available products often are mixtures of alkoxylated alkanols having different carbon numbers (for example ethoxylated ($C_{10}$–$C_{12}$) alkanols or ($C_{13}$–$C_{15}$) alkanols). The phosphoric acid alkyl esters are phosphoric acid mono-, di- or tri-($C_1$–$C_{15}$)-alkyl esters, trialkyl phosphates being preferred. Finally, preferred phosphoric acid esters are alkyl, aryl or aralkylphosphonic acid ($C_1$–$C_{15}$) alkyl esters.

The water-soluble or water-dispersible polymer preferably is a polyvinyl alcohol, polyvinylpyrrolidone, a copolymer containing units of vinyl alcohol and/or vinyl acetate and vinylpyrrolidone, a copolymer containing units of vinyl alcohol, acrylic acid, vinyl alkylamine and/or vinyl cycloalkylamine, a polyacrylamide, a copolymer containing units of acrylamide derivatives or vinylphosphonic acid, a polyethylene glycol, gum arabic, dextrin or another water-soluble or water-dispersible polymer or also a mixture of 2 or more thereof. Generally, the amount of water-soluble or water-dispersible polymer ranges from 0.1 to 90% by weight, preferably from 10 to 80% by weight, relative to the total weight of the non-volatile components of the covering layer.

The covering layer is prepared by applying an aqueous solution or dispersion containing the above-mentioned components and subsequent drying. The coating solution or dispersion used for the purposes of the present invention has an excellent storage stability and can even be stored as a concentrate. The solids content in the coating solution or dispersion generally ranges from 0.5 to 9% by weight, preferably from 2.0 to 8.0% by weight, the solids content in the concentrate from 10 to 40% by weight, preferably from 10 to 30% by weight.

The covering layer is relatively thin. In dried state, the covering layer generally has a weight of 0.5 to 5.0 $g/m^2$, preferably of 1.0 to 2.6 $g/m^2$.

The coating composition is primarily envisaged for preparing a covering layer in a recording material comprising at least one photosensitive layer, which exhibits reactive sensitivity to oxygen and thus has to be protected from (atmospheric) oxygen, as it is particularly the case with a radically or ionically photopolymerisable layer. Such layers generally contain at least one polymerisable ethylenically unsaturated monomer and at least one photopolymerisation initiator. In principle, the coating composition can however be used for preparing a covering layer in other photosensitive recording materials. These materials comprise for example a photosensitive layer based on diazonium compounds (particularly diazonium salt polycondensation products), quinone diazide compounds (especially orthoquinone diazides) or combinations of acid-cleavable compounds forming acid upon actinic irradiation. The above-mentioned recording materials are prepared by coating a base, preferably a base made of aluminium or aluminium alloys, in particular those pre-treated mechanically and/or chemically and/or electrochemically and/or being hydrophilised, with a positive-working or negative-working reproduction layer or a reversal method reproduction layer, imagewise exposing the element thus obtained and subsequently processing it using a developer solution. The covering layer of the present invention can also be applied on layers containing hardenable printing inks or hardenable ink-jet inks. Finally, the covering layer may also be used in layer transfer materials and electrophotographic recording materials.

Photosensitive layers, in particular photopolymerisable layers, usually further contain polymer binders, optionally also plasticisers, sensitising dyes, other dyes and/or pigments, controlling agents, radiation indicators, surfactants and/or wetting agents. The covering layer is applied to the photosensitive layer and is in direct contact therewith.

Useful binders for use in photosensitive layers include in particular polymers which are insoluble in water, but on the other hand soluble or at least swellable in organic solvents and aqueous-alkaline solutions. Particularly useful are polymers with lateral carboxyl groups, for example copolymers comprising units of (meth)acrylic acid, crotonic acid or maleic acid semi-esters, or polymers containing hydroxyl groups, some or all of which are converted with cyclic dicarboxylic anhydrides. The polymer binders generally have a molecular weight $M_w$ between 500 and 1,000,000, particularly between 1,000 and 200,000, and an acid number in the range of 10 to 250, preferably 20 to 200. Preferred binders are copolymers and mixed polymers of (meth) acrylic acid, crotonic acid and vinylacetic acid. The comonomers are alkyl (meth)acrylates, hydroxyalkyl (meth)

acrylates, allyl (meth)acrylates, aryl (meth)acrylates and/or (meth)acrylonitrile. Further suitable binders are copolymers of maleic anhydride and optionally substituted styrenes, unsaturated hydrocarbons, unsaturated ethers or esters. The anhydride groups present therein may also be esterified. The amount of the binders in the photosensitive mixture generally ranges from 20 to 90% by weight, preferably from 40 to 80% by weight, relative to the total weight of non-volatile components of the photosensitive layer.

The monomers in the photopolymerisable mixtures are generally ethylenically unsaturated compounds, particularly acrylic esters or methacrylic esters of divalent or polyvalent alcohols. Particular examples include ethylene glycol di(meth)acrylate, diethylene glycol di(meth)acrylate, (meth) acrylates of trimethylolethane, trimethylolpropane, pentaerythritol, dipentaerythritol and polyvalent alicyclic alcohols. Conversion products of mono- or diisocyanates containing partial esters of polyvalent alcohols can also be used advantageously. Also suitable, finally, are polymerisable compounds containing additionally photooxidisable groups and optionally also urethane groups. The photooxidisable groups are generally amino, urea or thio groups, which may also be constituents of heterocyclic rings. Particularly suitable photooxidisable groups are triethanolamino, triphenylamino, thiourea, imidazole, oxazole, thiazole, acetylacetonyl, N-phenylglycine and ascorbic acid groups. Of these polymerisable compounds, those containing primary, secondary, particularly however tertiary amino groups are preferred.

The photoinitiators can be selected from a range of substance classes. Suitable in particular are derivatives of benzophenone, acetophenone, benzoine, benzile, fluorenone, thioxanthone, acridine or quinazoline as well as of polynuclear quinones. Also worthy of mention are trichloromethyl-s-triazines, 2-halomethyl-5-vinyl-[1,3,4] oxadiazole derivatives, halogen oxazoles substituted with trichloromethyl groups and carbonyl methylene heterocycles containing trihalomethyl groups (DE-A 33 33 450). Also suitable, finally, are alkyl-bis-acyl-phosphine oxides, alkylaryl-bis-acylphosphine oxides, titanocenes, ferrocenes, azidosulphonyl phenyl phthalimides, ketoxime ethers and onium compounds (in particular diaryliodonium, diazonium or sulphonium compounds).

Particular sensitising dyes for use in the photosensitive layer are photoreducible xanthene, fluorene, benzoxanthene, benzothioxanthene, thiazine, oxazine, coumarin, pyronine, porphyrine, acridine, azo, disazo, cyanine, merocyanine, diarylmethyl, triarylmethyl, anthraquinone, phenylenediamine, benzimidazole, fluorochrome, quinoline, tetrazole, naphthol, benzidine, rhodamine, indigo, spiroborane and/or indanthrene dyes. The amount of sensitising dyes generally ranges from 0.01 to 15% by weight, preferably from 0.05 to 5% by weight, relative to the weight of the non-volatile components of the photosensitive layer.

A further improvement of the speed of the photosensitive layer can be attained by embedding coinitiators in the layer. Well-known examples are the combinations of titanocenes and trichloromethyl-s-triazines, titanocenes and ketoxime ethers and acridines and trichloromethyl-s-triazines. A further increase of the speed can be achieved by the addition of dibenzylidene acetone or amino acid derivatives. The amount of initiator(s) or coinitiator(s) generally ranges from 0.01 to 20% by weight, preferably from 0.05 to 10% by weight, relative to the weight of the non-volatile components of the photosensitive layer.

The photosensitive layer can be dyed with dyes or pigments. Useful for that purpose are phthalocyanine, rhodamine, triarylmethane, azo, disazo, anthraquinone, naphthol, indanthrone or phenylenediamine dyes or also inorganic coloured pigments. These coloured pigments are added to the coating solutions in a dissolved or dispersed form.

In order to set particular properties, the photosensitive layer can additionally contain inhibitors and controlling agents. These include benzophenone compounds, phosphorus compounds, cycloacetals, quinones, quinolines, naphthoquinones, anthraquinones, ethers, sterically hindered amines, benzothiazoles, thiurams, thiocarbamates, phenols, naphthols, benzimidazoles, mercaptobenzimidazoles and phenylenediamines. The amount of inhibitors and/or controlling agents generally ranges from 0.001 to 10% by weight, preferably from 0.005 to 5% by weight, relative to the weight of the non-volatile components of the photosensitive layer.

The layer bases in the said printing plates are preferably composed of metal, particularly aluminium, steel, zinc, copper or metal alloys, plastic, in particular polyethylene terephthalate (PET), cellulose acetate or polyamide (PA). Bases used for screen printing stencils consist in particular of Perlon gauze. In case of photoresists, a silicon wafer is usually used as base.

The surface of the base in many cases is pre-treated. Aluminium bases are often mechanically and/or chemically and/or electrochemically roughened, anodically oxidised and/or hydrophilised. The pre-treatment in particular brings about better adhesion of the reproduction layer to the substrate, leading to an improvement of the lithographic properties of the base—particularly its water acceptance and water retention capacity—or a decrease of the reflectivity generated by the base in the actinic range of the imagewise applied radiation (anti-halation). The same effect is achieved by coating the base with special layers composed for example of binders, pigments and optionally additives.

The preparation of the photosensitive recording materials can be performed according to methods known to those killed in the art. Generally, the components of the photosensitive layer are dissolved or dispersed in an organic solvent or solvent mixture, the solution or dispersion is applied to the given base by curtain coating, spray coating, dip coating, roll coating or in an similar manner and the solvent is removed during the subsequent drying step.

The imagewise exposure is effected with fluorescent tubes, pulsed xenon lamps or xenon arc lamps, metal-halide-doped high-pressure mercury vapour lamps or carbon arc lamps. In addition, exposure in conventional projectors and enlargers under the light of metal filament lamps, and contact exposure using common tungsten incandescent lamps are possible. Imagewise exposure can also be effected with the coherent light of a laser. Suitable lasers for that purpose are lasers of appropriate power, for example argon ion lasers, krypton ion lasers, dye lasers, solid state lasers, helium-cadmium lasers and helium-neon lasers, emitting in particular in the wavelength range of 250 to 1100 nm, preferably 400 to 700 nm. The laser beam can be controlled by means of preprogrammed linewise or halftonewise scanning movements.

The present invention also relates to the preparation of a printing form, wherein the recording material according to the present invention is imagewise exposed and subsequently developed. In general, the development is conducted with aqueous-alkaline solutions. The development process can be supported by brushes or other mechanical devices.

The following examples illustrate the present invention without however limiting it thereto. The designation (wt) denotes "part(s) by weight", the designation (vp) "parts by volume" (g/ml). Percent are percent by weight and quantity ratios are ratios by weight.

EXAMPLES

Using the compositions stated in table 1, coating solutions are produced which are then applied to a roughened, anodised aluminium base which is pre-treated with a hydrophilising agent. The dry coating weight of the lithographic printing plates is approximately 1.6 g/m$^2$.

TABLE 1

| | Photopolymerisable layers | | |
|---|---|---|---|
| Components | A wt | B wt | C wt |
| Binder 1 | 13 | | |
| Binder 2 | | 13 | 13 |
| Dispersion Blue | 1.0 | 1.0 | 1.0 |
| Monomer 1* | 10 | 10 | 7 |
| Monomer 2** | | | 0.9 |
| Irgacure 784 | 0.2 | 0.2 | 0.2 |
| Triazine*** | 0.02 | 0.02 | 0.02 |
| Ethyl eosines | 0.2 | 0.2 | 0.2 |
| Methoxypropanol | 35.58 | 35.58 | 37.68 |
| Total solids in % | 8.033 | 8.033 | 8.367 |

*Monomer according to EP-A 447 930, solution of 30% in methyl ethyl ketone
**polyethylene glycol dimethacrylate
***bis(trichloromethyl)phenylstyryl-s-triazine Binder 1:

To produce this binder, 7.8 g of methacrylic acid, 7.8 g of hydroxyethyl methacrylate and 44.4 g of allyl methacrylate were dissolved in 540 g of methyl ethyl ketone (MEK). The solution was then heated to 70° C. and 0.82 g of azo-bis-isobutyronitrile (AIBN) added in two equal portions at an interval of 4 hours. The solution was stirred altogether for 8 hours in a nitrogen atmosphere at this temperature, whereupon the 10% solution was cooled to room temperature while agitating.

Binder 2:

7.91 g of methacrylic acid and 52.09 g of methyl methacrylate were dissolved in 540 g of methyl ethyl ketone (MEK) and the solution was then heated to 80° C. 1.01 g of azo-bis-isobutyronitrile (AIBN) was then added to the heated solution in two equal portions at an interval of 2 hours. After agitating for a total of 5 h in a nitrogen atmosphere, the 10% solution was cooled to room temperature while agitating.

Binder 3:

51 g of polyvinyl butyral (®Mowital B30T, Clariant GmbH) and 13.5 g of trimellitic anhydride were dissolved in 269 mg of MEK and brought to reaction in the presence of 1.8 g of triethylamine at 80° C. for 5 hours. The reaction solution was then cooled to approximately 50° C. and 165 g of γ-butyrolactone was added. It was then further cooled to room temperature while agitating. The solution contains 13% of binder 3.

Dispersion Blue:

125 wt of binder solution 2, 125 wt of binder solution 3, 25 wt of ®Heliogen Blue D 7490 (pigment dye from BASF) and 279 wt of methoxypropanol are stirred for 30 minutes in a turbine agitator or a dissolver at 3,000 rpm and thereupon ground with glass balls (diameter approx. 1 mm) for 4 hours.

TABLE 2

| | Overcoat solutions | | | | | | | | | | | |
|---|---|---|---|---|---|---|---|---|---|---|---|---|
| Components in wt | 1 | 2 | 3 | 4 | 5 | 6 | 7 | 8 | 9 | 10 | 11 | 12 |
| Prior art and invention | US 3458311 | EP 352 630 | EP 403 096 | EP 275 147 | EP 738 929 | con-centrate | concentrate/ Invention | Invention | Invention | Invention | Invention | Invention |
| Polyvinyl alcohol 1)$^1$ | 3.0 | 3.5 | | 2.5 | 2.5 | 16.4 | 16.4 | 1.64 | 1.64 | 1.64 | 1.64 | 2.5 |
| Polyvinyl alcohol 2)$^2$ | | | 5 | | | | | 1.64 | 1.64 | 1.64 | 1.64 | |
| Polyvinylpyrrolidone | | 1.5 | | | | 8.2 | 8.2 | 1.64 | 1.64 | 1.64 | 1.64 | |
| Polyethylene imine | | 0.1 | | | | 0.4 | | | 0.04 | | | |
| Glycine | | | | | 2.5 | | | | | | | |
| PVA-co-PVP)$^5$ | | | | | 2.5 | | | | | | | 2.5 |
| Diphenyl iodonium hexafluorophosphate | | | 0.25 | | | | | | | | | |
| Ethylenediamine alkoxylate)$^7$ | | | | | | | 0.2 | 0.04 | 0.04 | | | 0.04 |
| Phosphoric acid alkyl ester)$^6$ | | | | | | | | | | 0.04 | | |
| Alkyl alcohol (C$_{13}$–C$_{15}$) ethoxylate (11EO))$^3$ | | | | | | | | | | | 0.04 | |
| Water | 97 | 95 | 95 | 95 | 95 | 75 | 75 | 95 | 95 | 95 | 95 | 95 |
| Alkyl alcohol (C$_{10}$–C$_{12}$) ethoxylate (7EO))$^3$ | | 0.1 | 0.03 | | | 0.02 | 0.02 | 0.004 | 0.004 | 0.004 | 0.004 | 0.004 |

TABLE 2-continued

| | Overcoat solutions | | | | | | | | | | | |
|---|---|---|---|---|---|---|---|---|---|---|---|---|
| Components in wt | 1 | 2 | 3 | 4 | 5 | 6 | 7 | 8 | 9 | 10 | 11 | 12 |
| Nonyl phenol ethoxylate (15EO))[4] | 0.1 | | | | | | | | | | | |
| Dilution with water | | | | | | 400 | 400 | | | | | |

)[1]® Polyviol G08/140 (Wacker Chemie)
)[2]® Polyviol G04/20 (Wacker Chemie)
)[3]® Lutensol A7 oder A07 (BASF)
)[4]® Arkopalo N-150 (Clariant)
)[5]® Luviskol VA 37 HM (BASF)
)[6]® Degressal SD 40 (BASF)
)[7]® Quadrol L (BASF)

Storage Stability of the Lithographic Printing Plates:

The prepared photopolymer layers A to C having a coating thickness of 2.1 g/m² were coated with overcoat solutions and subjected to an accelerated ageing test for up to 8 hours at 80° C. The dry layer thickness was 2.5 g/m². Exposure of the stored samples took 10 s using a 500 W exposure source containing tungsten filament lamps. The speed was evaluated by exposing an original containing a step wedge, the wedge steps of which had a density increment ΔD=0.15).

TABLE 3A

| Comparative example no. | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Layer according to table 1 | A | B | C | A | B | C | A | B | C | A | B | C | A | B | C |
| Layer according to table 2 no. | 1 | 1 | 1 | 2 | 2 | 2 | 3 | 3 | 3 | 4 | 4 | 4 | 5 | 5 | 5 |
| Storage time in h | | | | | | speed loss in % at 80° C. | | | | | | | | | |
| 0 | 0 | 0 | 0 | 0 | 0 | 0 | n.d. | n.d. | n.d. | 0 | 0 | 0 | 0 | 0 | 0 |
| 8 | 55 | 31 | 25 | 55 | 65 | 55 | n.d. | n.d. | n.d. | 12 | 25 | 12 | 50 | 37 | 37 | n.d. = not developable

TABLE 3B

| Invention example no. | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|
| Layer according to table 1 | A | B | C | A | B | C | A | B | C | A | B | C | A | B | C |
| Layer according to table 2 no. | 8 | 8 | 8 | 9 | 9 | 9 | 10 | 10 | 10 | 11 | 11 | 11 | 12 | 12 | 12 |
| Storage time in h | | | | | | speed loss in % at 80° C. | | | | | | | | | |
| 0 | 0 | 0 | 0 | 0 | 0 | 0 | 0 | 0 | 0 | 0 | 0 | 0 | 0 | 0 | 0 |
| 8 | 25 | 25 | 25 | 25 | 30 | 33 | 12 | 12 | 25 | 12 | 37 | 12 | 25 | 12 | 25 |

Layer thickness cases:
As for photopolymer layer C, the overcoat solutions 1 to 5 and 8 to 13 of table 2 were applied. The dry coating thickness was resp. 0.5 g/m², 2.5 g/m² and 5 g/m². Layer C was also subjected to an accelerated ageing test at 80° C. Exposure was carried out in the way described hereinbefore.

TABLE 4A

| Comparative example no. | 31 | 32 | 33 | 34 | 35 | 36 | 37 | 38 | 39 | 40 | 41 | 42 | 43 | 44 | 45 |
|---|---|---|---|---|---|---|---|---|---|---|---|---|---|---|---|
| Overcoat layer of table 2 no. | 1 | 1 | 1 | 2 | 2 | 2 | 3 | 3 | 3 | 4 | 4 | 4 | 5 | 5 | 5 |
| g/m² | 0.5 | 2.5 | 5.0 | 0.5 | 2.5 | 5.0 | 0.5 | 2.5 | 5.0 | 0.5 | 2.5 | 5.0 | 0.5 | 2.5 | 5.0 |
| Speed in % (fresh) | 100 | 100 | 200 | 88 | 125 | 150 | 200 | n.d. | n.d. | 100 | 150 | 200 | 125 | 150 | 200 |

| Storage time in h | | | | | | | speed loss in % at 80° C. | | | | | | | | |
|---|---|---|---|---|---|---|---|---|---|---|---|---|---|---|---|
| 0 | 0 | 0 | 0 | 0 | 0 | 0 | 0 | n.d. | n.d. | 0 | 0 | 0 | 0 | 0 | 0 |
| 8 | 50 | 25 | 63 | 25 | 55 | 75 | 25 | n.d. | n.d. | 17 | 12 | 50 | 25 | 37 | 63 | n.d.= not developable

TABLE 4B

| Invention examples no. | 46 | 47 | 48 | 49 | 50 | 51 | 52 | 53 | 54 | 55 | 56 | 57 | 58 | 59 | 60 |
|---|---|---|---|---|---|---|---|---|---|---|---|---|---|---|---|
| Overcoat layer of table 2 no. | 8 | 8 | 8 | 9 | 9 | 9 | 10 | 10 | 10 | 11 | 11 | 11 | 12 | 12 | 12 |
| g/m² | 0.5 | 2.5 | 5.0 | 0.5 | 2.5 | 5.0 | 0.5 | 2.5 | 5.0 | 0.5 | 2.5 | 5.0 | 0.5 | 2.5 | 5.0 |
| Speed in % (fresh) | 150 | 200 | 300 | 200 | 200 | 250 | 200 | 250 | 300 | 175 | 175 | 200 | 175 | 200 | 250 |

| Storage time in h | | | | | | | speed loss in % at 80° C. | | | | | | | | |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 |
| 8 | 25 | 25 | 25 | 25 | 25 | 33 | 12 | 12 | 25 | 6 | 12 | 12 | 12 | 25 | 25 |

Viscosity:

The viscosity is a measure for the evaluation of the coatability in flow coating systems. The viscosity of the coating compositions of the invention should not or but only slightly be altered by the action of the additives. The polyethylene imine concentration of the overcoat solutions no. 2 and 9 of table 2 was increased to 800% and the solutions were diluted to 3% with water. The viscosity was measured with a Ubbelohde viscosimeter from Fa. Schott Glaswerke GmbH Mainz. The concentration of polyethylene imine of the basic solution is equal to 100%.

TABLE 5

| Examples | comparative | | | | invention | | | |
|---|---|---|---|---|---|---|---|---|
| No. | 61 | 62 | 63 | 64 | 65 | 66 | 67 | 68 |
| Overcoat of table 2 No. | 2 | 2 | 2 | 2 | 9 | 9 | 9 | 9 |
| Polyethylene imine in % | 100 | 200 | 400 | 800 | 100 | 200 | 400 | 800 |
| Viscosity in mm²/s | 3.70 | 4.09 | 4.45 | 4.91 | 3.11 | 3.09 | 3.40 | 3.40 |

TABLE 6

| Examples | comparative | | | | invention | | | |
|---|---|---|---|---|---|---|---|---|
| No. | 69 | | | | 70 | | | |
| Overcoat of table 2 | 9, but without polyethylene imine | | | | 9 | | | |
| Temp. in ° C. | 26 | 28 | 30 | 32 | 26 | 28 | 30 | 32 |
| Oxygen concentration in mg/l | 7.1 | 7.6 | 7.4 | 6.9 | 6.1 | 6.5 | 6.3 | 6.3 |

(Atmospheric) Oxygen

Air that is dissolved in aqueous systems can lead to heavy disturbances and coating defects during the coating process. Measuring the oxygen concentration allows an evaluation of the air concentration. Solution 9, which was prepared with and without (9*) polyethylene imine, was compared in a temperature profile. Measuring took place with a measuring apparatus ECM Multi and the oxygen probe from Fa. Dr. Bruno Lange GmbH, Düsseldorf.

Foaming:

The foaming behaviour of the overcoat solutions provides knowledge about the stability of gas bubbles in the solution and their deaerating behaviour. A rapid deaeration and limited foaming are desired properties. For processing printing plates the overcoat of which is to be rinsed off again weakly foaming solutions are preferred, as overflowing foam can cause operational defects in the processing units. Samples of 20 ml of overcoat solution each were agitated 5 times at 25° C. in a 100-ml measuring glass equipped with stopper and the foam height was read off from a ml scale.

TABLE 7A

| Comparative examples No. | 71 | 72 | 73 | 74 | 75 | 76 | 77 |
|---|---|---|---|---|---|---|---|
| Overcoat according to table 2 | 1 | 2 | 2 | 2 | 2 | 4 | 5 |
| Polyethylene imine in % | 100 | 100 | 200 | 400 | 800 | 100 | 100 |
| Foam in ml after 0 min. | 28 | 28 | 29 | 29 | 26 | 36 | 35 |
| Foam in ml after 2 min. | 23 | 26 | 27 | 27 | 25 | 34 | 31 |

TABLE 7B

| Invention Examples No. | 78 | 79 | 80 | 81 | 82 | 83 | 84 | 85 |
|---|---|---|---|---|---|---|---|---|
| Overcoat according to table 2 No. | 6 | 7 | 9 | 9 | 9 | 9 | 10 | 12 |
| Polyethylene imine in % | 100 | 100 | 100 | 200 | 400 | 800 | 100 | 100 |
| Foam in ml after 0 min. | 26 | 20 | 20 | 20 | 19 | 18 | 10 | 18 |
| Foam in ml after 2 min. | 23 | 19 | 18 | 18 | 19 | 18 | 7 | 16 |

Developer Exhaustion Test:

The offset printing plates coated with the example solutions were subjected to a development test. The developer used was regarded as exhausted, when developer-insoluble residues originating from the coating solution congregate into larger particles and are transferred back by the brushes and rollers onto the plates (redeposition). For the development test, offset printing plates with the same speed were selected that, however, differed from one another as for their overcoat layer formulation and overcoat coating weight. The foam formation was controlled by using the defoaming agent ®Ozasol RC31 (Agfa-Gevaert). The quantity of the defoaming agent is at the same time a measure for the foaming tendency of an overcoat-loaded developer solution.

A developer with the following composition was used 1.0 wt of trisodium citrate×2 $H_2O$ 2.0 wt of 1-amino-propanol-2

1.4 wt of benzyl alcohol 1.5 wt of sodium cumenesulphonate 0.04 wt of sodium metasilicate×5 $H_2O$ 0.02 wt of fatty alcohol polyglycol ether 0.03 wt of tetrasodium-ethylenediaminetetraacetate 94.04 wt of water The processing of the printing plates took place in a VSO 85 processor from Glunz and Jensen. The developer solution was added to this processor, pumped by means of nozzles onto the surface of the printing plate and distributed by an oscillating brush. The soluble areas of the printing plates are rubbed out. After 20 $m^2$ of unexposed printing plate material in each case, an exposed plate was processed in order to check the reproducibility of the development process. The developer was replenished at a rate of 30 ml/$m^2$.

TABLE 8

| Developer exhaustion after $m^2$ of processed printing plate | | | | | | | | | |
|---|---|---|---|---|---|---|---|---|---|
| Examples No. | 86 | 87 | 88 | 89 | 90 | 91 | 92 | 93 | 94 |
| Layer 2.1 g/$m^2$ | A | A | A | B | B | B | C | C | C |
| Overcoat No. | 4 | 9 | 10 | 4 | 9 | 10 | 4 | 9 | 10 |
| Overcoat in g/$m^2$ | 5.0 | 0.5 | 0.5 | 5.0 | 0.5 | 0.5 | 5.0 | 0.5 | 0.5 |
| Exhaustion after $m^2$ | 55 | 140 | 150 | 75 | 170 | 185 | 90 | 230 | 240 |
| Defoaming agent in ml | 65 | 30 | 0 | 85 | 35 | 5 | 80 | 30 | 10 |

Overcoat Concentrates:

The preparation of overcoat concentrates offers numerous advantages for the production of the coatings. Depending on the concentration degree, more than 50% working hours, energy and cooling water can be saved. "In situ" dilution at the coating unit by means of static mixing devices makes it even possible to avoid large volume pre-dilutions of the concentrates before coating. The overcoat concentrates were stored at 30° C., except for the comparative overcoats. Before coating, the concentrates 6 and 7 according to table 2 were diluted.

TABLE 9

| | Storage of overcoat concentrate | | | | | | | | |
|---|---|---|---|---|---|---|---|---|---|
| Examples No. | 95 | 96 | 97 | 98 | 99 | 100 | 101 | 102 | 103 |
| Overcoat Nr. | 2 | 2 | 2 | 6 | 6 | 6 | 7 | 7 | 7 |
| Storage at 30° C. in days | 0 | 14 | 84 | 0 | 14 | 84 | 0 | 14 | 84 |
| Concentrate, without dilution with water | | + | + | | + | + | | + | + |
| Layer 2.1 g/m$^2$ | C | C | C | C | C | C | C | C | C |
| Speed in % | 100 | 75 | 38 | 110 | 95 | 75 | 105 | 110 | 105 |

What is claimed is:

1. A photosensitive recording material comprising a base, a photopolymerizable layer and a covering layer, wherein the covering layer contains a mixture of at least one water-soluble or at least water-dispersible polymer and at least one additive, the additive being selected from the group consisting of alkoxylated alkylenediamines, phosphoric acid ($C_1$–$C_{15}$) alkyl esters and phosphoric acid ($C_1$–$C_{15}$) alkyl esters and the amount of additive being in the range of 0.001 to 10.0% by weight, relative to the total weight of the non-volatile components of the covering layer.

2. Photosensitive recording material according to claim 1, wherein the amount of the additive is in the range of 0.01 to 1.0% by weight, relative to the total weight of the non-volatile components of the covering layer.

3. Photosensitive recording material according to claim 1, wherein the water-soluble or water-dispersible polymer is selected from the group consisting of polyvinyl alcohol, polyvinylpyrrolidone, a copolymer containing units of vinyl alcohol and/orvinyl acetate and vinylpyrrolidone, a copolymer containing units of vinyl alcohol, acrylic acid, vinyl alkylamine and/or vinyl cycloalkylamine, a polyacrylamide, a copolymer containing units of acrylamide derivatives or vinylphosphonic acid, a polyethylene glycol, gum arabic, dextrin and a mixture of 2 or more thereof.

4. The photosensitive material according to claim 3, wherein the amount of water-soluble or water-dispersible polymer ranges from 10 to 80% by weight relative to the total weight of the non-volatile components of the covering layer.

5. The photosensitive recording material according to claim 4, wherein the covering layer has a weight of 1.0 to 2.6 g/m$^2$.

6. The photosensitive recording material according to claim 5, wherein the base is made of aluminum, steel, zinc, copper, a metal alloy, poly(ethylene terephthalate), cellulose acetate or polyamide.

7. Photosensitive material according to claim 1, wherein the amount of water-soluble or water-dispersible polymer ranges from 0.1 to 90% by weight relative to the total weight of the non-volatile components of the covering layer.

8. Photosensitive material according to claim 1, wherein the photopolymerizable layer contains at least one polymerizable, ethylenically unsaturated monomer and at least one photopolymerzation initiator.

9. Photosensitive recording material according to claim 1, wherein the covering layer has a weight of 0.5 to 5.0 g/m$^2$.

10. Photosensitive recording material according to claim 1, wherein the base is made of metal, a metal alloy, plastic, or polyamide.

11. Photosensitive recording material according to claim 1, wherein the base is made of metal and is pre-treated mechanically, chemically and/or electrochemically and is optionally treated with a hydrophilising agent.

12. Photosensitive recording material according to claim 11, wherein the hydrophilising agent is polyvinylphosphonic acid.

13. Process for preparing a printing plate, which comprises imagewise exposing and subsequently developing the photosensitive recording material as defined in claim 1.

14. The photosensitive recording material according to claim 1, wherein the additives have an average molecular weight ($M_w$) of less than 3,000.

15. The photosensitive recording material according to claim 1, wherein said at least one water-soluble or at least water-dispersible polymer has an average molecular weight ($M_w$) of 5,000 to 1,000,000.

16. The photosensitive recording material according to claim 14, wherein said at least one water-soluble or at least water-dispersible polymer has an average molecular weight ($M_w$) of 10,000 to 500,000.

17. A process to prepare a cover layer which comprises applying an aqueous solution or dispersion containing at least one water-soluble or at least water-dispersible polymer and at least one additive, the additive being selected from the group consisting of alkoxylated alkylenediamines, phosphoric acid ($C_1$–$C_{15}$) alkyl esters and phosphoric acid ($C_1$–$C_{15}$) alkyl esters and the amount of additive being in the range of 0.001 to 10.0% by weight, relative to the total weight of the non-volatile components of the covering layer to a layer and drying said layer.

18. The process as claimed in claim 17, wherein said solution or dispersion contains from 0.5 to 9% by weight of solids.

* * * * *

UNITED STATES PATENT AND TRADEMARK OFFICE
CERTIFICATE OF CORRECTION

PATENT NO.      : 6,410,205 B1
DATED           : June 25, 2002
INVENTOR(S)     : Leichsenring et al.

It is certified that error appears in the above-identified patent and that said Letters Patent is hereby corrected as shown below:

<u>Column 17,</u>
Line 36, delete "and/orvinyl" and insert -- and/or vinyl --.

Signed and Sealed this

Twenty-seventh Day of August, 2002

Attest:

Attesting Officer

JAMES E. ROGAN
Director of the United States Patent and Trademark Office